United States Patent [19]
Maegawa

[11] Patent Number: 5,821,585
[45] Date of Patent: Oct. 13, 1998

[54] THIN FILM TRANSISTOR AND MANUFACTURING METHOD THEREOF

[75] Inventor: Shigeto Maegawa, Hyogo, Japan

[73] Assignee: Mitsubishi Denki Kabushiki Kaisha, Tokyo, Japan

[21] Appl. No.: 304,906

[22] Filed: Sep. 13, 1994

[30] Foreign Application Priority Data

Sep. 29, 1993 [JP] Japan ................................. 5-242814

[51] Int. Cl.⁶ ..................... H01L 27/01; H01L 27/12; H01L 31/0392
[52] U.S. Cl. ......................... 257/347; 257/348
[58] Field of Search ....................... 257/347, 348

[56] References Cited

U.S. PATENT DOCUMENTS 4,007,294  2/1977  Woods et al. ........................ 257/410

FOREIGN PATENT DOCUMENTS 2-130961  5/1990  Japan.
2-210871  8/1990  Japan.
5-13718   1/1993  Japan.
5-90586   4/1993  Japan.

OTHER PUBLICATIONS

"Device Sensitivity of Field–Plated Polysilicon High–Voltage TFT's and Their Application to Low–Voltage Operation", Tlao–Yuan Huang et al., IEEE Electron Device Letters, vol. 11, No. 11, Nov. 1990, pp. 541–543.

"Field–Induction–Drain (FID) Poly–Si TFTS with High On/Off Current Ratio", Kengi Tanaka et al., Extended Abstracts of the 22nd (1990 International Conference on Solid State Devices and Materials, Sendai, 1990, pp. 1011–1014.

"A Simple Polysilicon Thin Film Transistor Structure for Achieving High On/Off Current Ratio Independent of Gate Bias", Kanicki and Hatalis, Extended Abstracts of the 1992 International Conference on Solid State Devices and Materials, pp. 52–54.

"Thin Film Transistor", Takeshi Okazawa et al., Nikkei Microdevices 1988 Sep. No. 39, pp. 123–130.

"The Polysilicon TFT Technology for High Density SRAMS", Fumihiko Hayashi et al., Technical Report of the Institute of Electronics pp.27–34.

"16Mbit SRAM Cell Technologies for 2.0V Operation", H. Ohkubo et al., IEDM 1991, pp. 481–484.

"Performance and Reliability Improvement in Poly–Si TFTS by Fluorine Implantation", S. Maegawa et al., IEDM 1993, pp. 41–44.

"Trench–Isolation Technology using A1 Ion Implantation in a SIO2 Layer", Takao Miura et al., 1988 Symposium on VLSI Technology, pp. 19–20.

"Negative Bias Temperature Instability in Poly–Si TFTS's", Maeda et al. 1993 Symposium on VLSI Technology pp. 29–30.

*Primary Examiner*—Stephen Meier
*Attorney, Agent, or Firm*—McDermott, Will & Emery

[57] ABSTRACT

A thin film transistor includes an active layer having an offset region formed between a channel region and a drain region, a first insulating film formed on an upper surface of the active layer, a gate electrode formed at a position opposing to the channel region with the first insulating film interposed, and a second insulating film formed at a position opposing to the offset region with the first insulating film interposed and including impurities for forming charges. The charges formed in the second insulating film are provided by implanting fluorine ions, for example, if the charges are to be negative charges. By this structure, the on current of the thin film transistor can be increased and the leak current can be reduced.

25 Claims, 11 Drawing Sheets

THIN FILM TRANSISTOR AND MANUFACTURING METHOD THEREOF

BACKGROUND OF THE INVENTION

1. Field of the Invention

The present invention relates to a thin film transistor and manufacturing method thereof, and more specifically, to a thin film transistor used for static memory or for a liquid crystal display, as well as to the manufacturing method thereof.

2. Description of the Background Art

A thin film transistor is used as a load transistor of an SRAM (Static Random access memory) or a control transistor of a liquid crystal display, for example. Conventional examples of thin film transistors used as load transistors of static memories are disclosed, for example, in *Technical Report of the Institute of Electronics, Information and Communication Engineers* volume 91, No. 64, May 23, 1991, pp. 27–34, and in *NIKKEI Micro Devices*, September 1988, No. 39, pp. 123–130.

FIG. 23 is an equivalent circuit diagram of a static memory in which a thin film transistor is used as load transistor. This equivalent circuit diagram has been provided in the former one of the aforementioned two articles. The conventional structure of the thin film transistor used as the load transistor in the equivalent circuit of FIG. 23 is shown in FIG. 20. Referring to FIG. 20, the conventional thin film transistor includes a gate electrode 3 of silicon, selectively formed on a substrate 1 with a silicon oxide film 2 interposed. Surfaces of silicon oxide film 2 and of gate electrode 3 are covered with a gate insulating film of silicon oxide. On gate insulating film 4, a polycrystalline silicon film 5 which will serve as an active layer is formed, in which polycrystalline silicon 5, there are formed an n doped channel region 5a, a p doped source region 5b and a p doped drain region 5c. When a negative voltage is applied to gate electrode 3, there is provided a p type inversion layer. In the conventional thin film transistor, an end portion B of drain region 5 is positioned above the vicinity of a side end of gate electrode 3, and there is not a so called offset region. This type of thin film transistor includes ones having a p type channel region and ones having an n type channel region. For convenience, only the one having a p type channel region is shown.

The operation of the conventional thin film transistor having the structure shown in FIG. 20 will be described. In the conventional thin film transistor shown in FIG. 20, when a 0 to negative voltage is applied to the gate electrode 3 while a negative voltage is being applied to drain region 5c, a p type inversion layer A is formed below the channel region 5a and power starts to flow from source region 5b to drain region 5c. In other words, the drain current can be controlled by the gate electrode. In the conventional thin film transistor having such a structure, there is not a problem when gate electrode 3 is at a negative voltage (hereinafter referred to as "on state"). However, the following problem arises when the gate electrode is at 0 volt (hereinafter referred to as the "off state"). In the off state, there is theoretically no drain current. However, at the end portion B of drain region 5c to which the drain voltage and the gate voltage are applied, a current is generated and flows through defects in polycrystalline silicon film 5 because of an electric field generated by the potential difference, which generated current serves as the drain current. More specifically, different from a single crystal film, there are considerable number of crystal defects in polycrystalline silicon 5, and therefore when an electric field is applied thereto, carriers are emitted from crystal defects, resulting in generation of current.

In order to reduce such a current flowing in the off state (hereinafter referred to as "off current"), a thin film transistor employing a so called off set structure has been disclosed in the aforementioned two prior art articles. A thin film transistor having the off set structure disclosed in the latter one of the two articles above has a cross sectional structure shown in FIG. 24. FIG. 24 shows one cross section of a memory cell of a static memory to which a thin film transistor is applied as a load transistor, in which the thin film transistor includes a gate electrode 103 formed on a surface of a substrate 101 with an insulating film 102 interposed, and an active layer 105 formed on surfaces of insulating film 102 and of gate electrode 103, with a gate insulating film 104 interposed. Active layer 105 includes an n-doped channel region 105a positioned approximately above gate electrode 103, a source region 105b continuous to the left end of channel region 105a, and a drain region 105c continuous to the right side of channel region 105a. Between channel region 105a and drain region 105c, there is provided an offset region 105d having the length of Loff. The upper surface of active layer 105 is covered by an interlayer insulating film 106, and on the upper surface of interlayer insulating layer 106, a silicide interconnection 107 which will be a ground line, a silicon oxide film 108 and bit lines 109 and 110 of aluminum interconnection are successively deposited.

A thin film transistor having an offset structure is also disclosed in the former one of the aforementioned two prior art articles, which transistor has such a structure as shown in FIG. 21. The conventional thin film transistor shown in FIG. 20 includes, similar to the thin film transistor shown in FIG. 21, a gate electrode 3 selectively formed on a substrate 1 with a silicon oxide film 2 interposed, and a gate insulating film 4 formed to cover the surface of silicon oxide film 2 and of gate electrode 3. On the surface of gate insulating film 4, channel region 5a, source region 5b and drain region 5c are formed. The thin film transistor shown in FIG. 21 differs from the conventional thin film transistor shown in FIG. 20 in that it includes, as the prior art example shown in FIG. 24, an offset region 5d of a prescribed length provided between channel region 5a and drain region 5c. Offset region 5d has the same n type conductivity as channel region 5a. In the thin film transistor shown in FIG. 21, drain region 5c and channel region 5a come to be spaced by about 0.1 μm to 0.5 μm, because of the existence of offset region 5d. Since drain region 5c and gate electrode 3 are spaced apart by the provision of such offset 5d, the electric field generated at the end portion B of drain region 5c in the off state can be relaxed, enabling reduction of the off current.

Since the conventional thin film transistor having the offset structure is configured as described above, in the on state, the p type inversion layer A is generated only in channel region 5a as shown in FIG. 21, and the p type inversion layer A does not reach the drain region 5c. In other words, in offset region 5d, p type inversion layer A is not generated but this region is kept n type, so that offset region 5d serves as a resistance, undesirably reducing the current flowing in the on state (hereinafter referred to as "on current"). Namely, in the conventional thin film transistor, though the off current can be reduced, the on current is also reduced simultaneously, resulting in a problem that desired operational characteristics of the thin film transistor can not be obtained.

SUMMARY OF THE INVENTION

An object of the present invention is to provide a thin film transistor structure enabling reduction of off current without reducing on current, and to provide a method of manufacturing a thin film transistor.

The above described objects of the present invention can be attained by a thin film transistor in accordance with a first aspect of the present invention which includes an active layer including a channel region of a first conductivity type, a source region of a second conductivity type adjacent to one end of the channel region, an offset region of the first conductivity type having one end connected to the other end of the channel region, and a drain region of the second conductivity type connected to the other end of the offset region; a first insulating film formed on a first surface of the active layer; a gate electrode formed at a position opposing to the channel region with the first insulating film interposed; and a second insulating film positioned opposing to the offset region with the first insulating film interposed, including an impurity for forming charges.

In this structure, charges are formed as an impurity is introduced to the second insulating film, majority carriers in the offset region move because of the electric field of the charges, and conductivity type of the offset region on the second insulating film side is inverted, providing a slightly inverted layer. As a result, the on current increases in the on state. In the off state, the electric field caused by the potential difference between the gate electrode and the drain voltage is relaxed, and hence the off current is reduced.

The active layer constituting the thin film transistor includes, for example, an impurity doped polycrystalline silicon layer.

When the second conductivity type as the conductivity type of the drain region is p type, the charges formed in the second insulating film must be negative charges. Fluorine is used, for example, as the impurity for forming negative charges in the second insulating film. If the second conductivity type is n type, the charge formed in the second insulating film must be positive charges.

The thin film transistor in accordance with a second aspect of the present invention includes an active layer including a channel region of a first conductivity type, a source region of a second conductivity type adjacent to one end of the channel region, an offset region of the first conductivity type having one end connected to the other end of the channel region, and a drain region of the second conductivity type connected to the other end of the offset region; a first insulating film formed on a first surface of the active layer; a gate electrode formed at a position opposing to the channel region with the first insulating film interposed; and a second insulating film formed at a position opposing to the offset region on the side of a second surface of the active layer and including an impurity for forming charges.

In this structure, since the second insulating film forming charges is provided at a position opposing to the offset region on the side of the second surface of the active region, majority carriers on the side of the second surface of the active layer in the offset region are repelled by the application of the second insulating film and the majority carriers move to the side of the first surface, whereby a slightly inverted layer is formed in the offset region. As a result, similar to the thin film transistor in accordance with the first aspect described above, the on current can be increased while the off current can be reduced.

The thin film transistor in accordance with a third aspect of the present invention includes an active layer, a first insulating film and a gate electrode which are similar to those of the thin film transistor in accordance with the first aspect described above, and in addition, a control electrode formed at a position opposing to the offset region with the first insulating film interposed and connected to the drain region.

In this structure, the control electrode connected to the drain region is constantly kept at a prescribed potential because of the drain voltage. Therefore, by the potential of the control electrode, a slightly inverted layer is formed on the side of the control electrode of the offset region and, as a result, the on current increases in the on state, and off current is reduced in the off state, as the electric field generated by the potential difference between the gate voltage and the drain voltage is relaxed.

To the control electrode of the thin film transistor, an interconnection layer for applying a prescribed voltage to the drain region, for example, is connected.

Preferably, the gate electrode and the control electrode should have regions opposing to each other with the insulating film interposed, that is, regions overlapped with each other when viewed two-dimensionally. Such an overlap of regions of the gate electrode and control electrode provides an electrostatic capacitance between the gate electrode and the control electrode, which capacitance serves to increase the capacitance between a cell power supply Vcc and a storage electrode in the cell in an SRAM, for example, and as a result, makes the cell operation less susceptible to soft errors.

In a preferred embodiment of the thin film transistor, a sidewall of a gate electrode and a sidewall of the control electrode oppose to each other with the first insulating film interposed, with the distance therebetween being preferably from 0.02 $\mu$m to 0.2 $\mu$m. If the distance is smaller than 0.02 $\mu$m, the effect of reducing the off current is not sufficient, while if it exceeds 0.2 $\mu$m, the effect of increasing the on current is not sufficient.

In a more preferred embodiment of the thin film transistor, a sidewall of the gate electrode and a sidewall of a control electrode oppose to each other with a first insulating film interposed, and the respective sidewalls are covered with a dielectric sidewall film. Since the sidewall film can be formed in self-aligned manner, such a structure enables the distance between the opposing gate electrode and the control electrode with the first insulating film interposed to be processed smaller than the minimum possible patterning dimension in accordance with the applied design rule.

A thin film transistor in accordance with a fourth aspect of the present invention includes an active layer including a channel region, a source region adjacent to one end of the channel region, an offset region having one end connected to the other end of the channel region, and a drain region connected to the other end of the offset region; a first insulating film formed on a first surface of the active layer; and a gate electrode formed at a position opposing to the channel region with the first insulating film interposed; in which the offset region is of the same conductivity type as the drain region, and work function difference between the gate electrode and the active layer is set to have an enhancement type threshold voltage.

According this structure, since the offset region of the active layer is of the same conductivity type as the source and the drain regions, resistance against carriers of the offset region decreases, and hence the on current increases in the on state. In the off state, the electric field caused by the potential difference between the gate voltage and the drain voltage is released, and the off current is reduced. In the thin film transistor of this structure, the channel region formed to have the same conductivity type as the conductivity type of the offset region has, as it is, a depletion type threshold voltage, because of the need for minimizing the number of manufacturing steps. In a depletion type device, the transistor turns on even if the gate voltage is 0V, and a current flows. However, when the thin film transistor is applied to an SRAM, for example, it is required to make the current as small as possible with the gate voltage of 0V. Therefore, the work function difference between the gate electrode and the active layer is set to provide the enhancement type threshold voltage.

In order to provide the enhancement type threshold voltage mentioned above, the absolute value of the work function difference between the gate electrode and the active layer is set to be larger than 1V, for example. Magnesium is used, for example, as the material of the gate electrode which satisfies such a condition.

A thin film transistor in accordance with a fifth aspect of the present invention includes an active layer of a first conductivity type including a channel region, a source region adjacent to one end of the channel region, an offset region having one end connected to the other end of the channel region, and a drain region positioned on the other end of the offset region; a first insulating film formed on a first surface of the active layer; and a gate electrode formed at a position opposing to the channel region with the first insulating film interposed; in which sufficient amount of charges for providing enhancement type threshold voltage are included in the first insulating film.

According to this structure, as the thin film transistor in accordance with the fourth aspect described above, since the offset region of the active layer is of the same conductivity type as the source and the drain regions, resistance against carriers of the offset region decreases, and in the on state, the on current increases. In the off state, the electric field caused by the potential difference between the gate voltage and the drain voltage is relaxed, and the off current is reduced. Further, it is set to have the enhancement type threshold voltage without specifically setting the work function difference between the gate electrode and the active layer, by introducing prescribed charges in the first insulating film.

A thin film transistor in accordance with a sixth aspect of the present invention includes an active layer including a channel region, a source region adjacent to one end of the channel region, an offset region having one end connected to the other end of the channel region, and a drain region connected to the other end of the offset region; a first insulating film formed on a first surface of the active layer; and a gate electrode formed at a position opposing to the channel region with the first insulating film interposed; in which junction width of the drain region and the offset region is set to be narrower than the width of the channel region.

In this structure, since the junction width of the drain region and the offset region is set narrower than the width of the channel region, the leak current in the off state which is in proportion to the junction area (junction width×thickness of the active layer) at an end portion of the drain region can be reduced, while the on current, which is proportional to the ratio of the width of the channel region with respect to the length of the channel region suffers from least possible reduction.

In accordance with the first aspect described above, when the first conductivity type is n type and the second conductivity type is p type, the thin film transistor is formed with ion-implanting fluorine or aluminum into the second insulating film, so that negative charges are formed in the second insulating film.

The thin film transistor in accordance with the second aspect described above, which has the control electrode, is manufactured through the following steps. At first, the control electrode is formed on the substrate, and the first insulating film is formed on the control electrode. Then, the gate electrode is formed to have an overlap with the control electrode, on the first insulating film, the second insulating film is formed on the gate electrode, and an opening deep enough to reach the control electrode is provided in the second and the first insulating films. Thereafter, the active layer is formed on the first insulating film, and through the opening, the control electrode is connected to a portion of the active layer which will be the drain region.

The above described step of forming the control electrode and the step of forming the gate electrode can be performed simultaneously, since both of these steps include the step of forming a polycrystalline silicon film on the insulating film, and the step of patterning the polycrystalline silicon film to provide the gate electrode and the control electrode, respectively. Therefore, the number of process steps can be reduced, improving production yield.

The thin film transistor in accordance with the second aspect described above can also be formed effectively through the following steps. Namely, the offset region and the channel region of the active layer are masked, ions forming charges in the gate insulating film are introduced such that the range of the ions reach the gate insulating film on the gate electrode, and an impurity providing the same conductivity type as the source and drain regions is introduced to the entire surface of the active layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
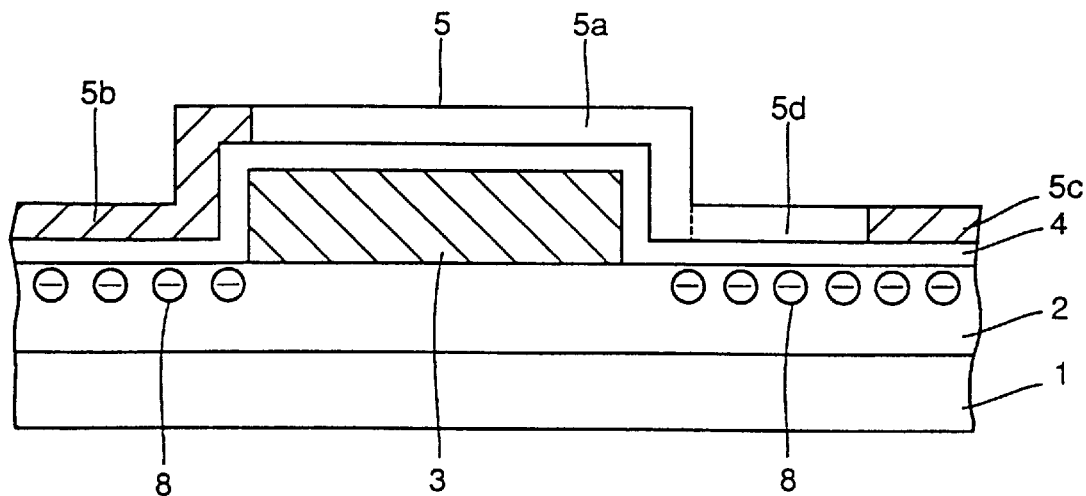
FIG. 1 is a cross section showing a structure of a thin film transistor in accordance with a first embodiment of the present invention.

A first embodiment of the present invention will be described with reference to FIGS. 1 to 5. Referring to FIG. 1, in the thin film transistor in accordance with the first embodiment of the present invention, a gate electrode 3 is selectively formed on a surface of a substrate 1 with a silicon oxide film 2 interposed, and surfaces of silicon oxide film 2 and of gate oxide film 3 are covered with a gate insulating film 4. On the surface of gate insulating film, a polycrystalline silicon film 5, which will serve as the active layer, is formed, and in a region of polycrystalline silicon film 5 above the gate electrode, an n type channel region 5a is formed. Further, in polycrystalline silicon film 5, a p type source region 5b is connected to the left end of channel region 5a, and a p type drain region 5c is provided on the right end of channel region 5a with an n type offset region 5d provided therebetween. In at least a region below the offset region 5d of silicon oxide film 2, negative fixed charges 8 are provided.

Figure 2:
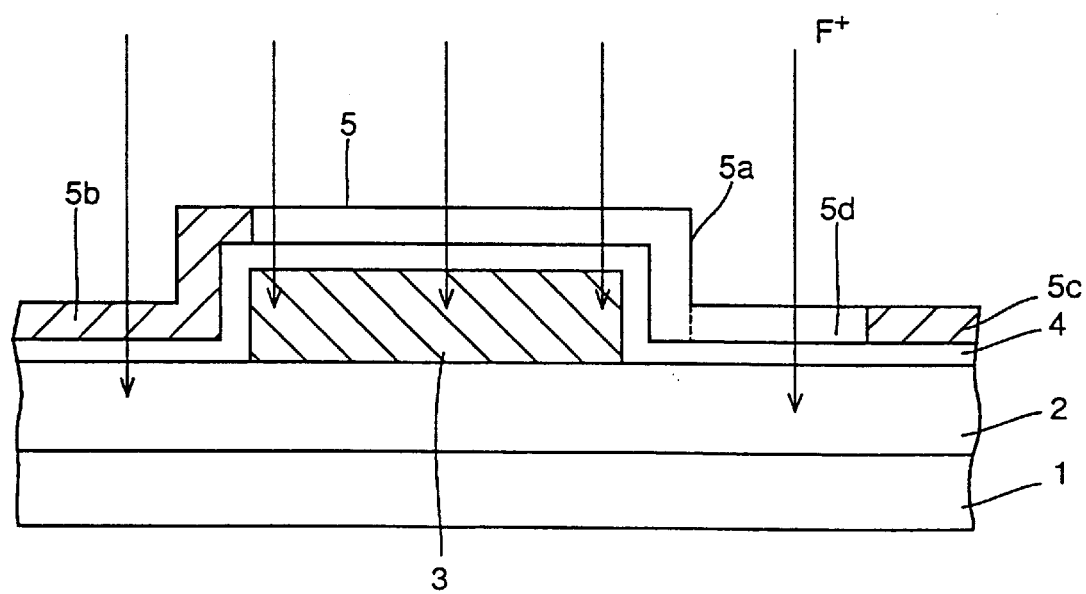
FIG. 2 is a cross section showing the step of implanting fluorine ions to a silicon oxide film 2, among the steps for manufacturing the thin film transistor in accordance with the first embodiment of the present invention.
Figure 3:
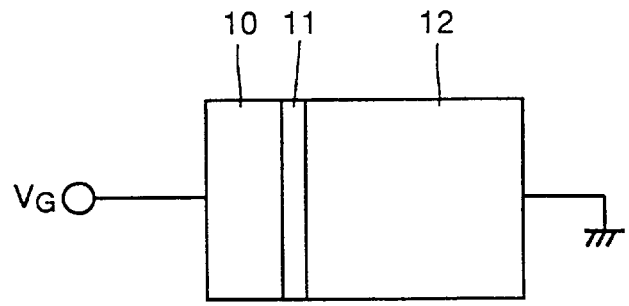
FIG. 3 schematically shows a structure of a common MOS (Metal Oxide Semiconductor) used in an experiment for proving formation of negative charges in the insulating film by the ion-implanted fluorine.

Referring to FIG. 2, negative charges 8 are introduced to silicon oxide film 2 in the thin film transistor in the following manner. At first, source region 5b and drain region 5c are formed by introducing a p type impurity such as boron (B) into the polycrystalline silicon film 5 to attain the concentration of about $1\times10^{19}/cm^3$, and then fluorine (F) is ion-implanted from above to the entire surface of the thin film transistor. The implant energy of fluorine is selected such that the center of the range of fluorine is positioned in the silicon oxide film 2 below the offset region 5d. For example, if polycrystalline silicon film 5 has the thickness of 400 Å and gate insulating film 4 has the thickness of 300 Å, preferable implant energy of fluorine is about 40 keV. The dosage of fluorine is preferably in the range of from $1\times10^{14}/cm^2$ to $1\times10^{16}/cm^2$, and when set in this manner, it causes potential change of offset region 5d. Since fluorine is introduced to the entire upper surface of thin film transistor, it is also introduced to gate electrode 3. However, since gate electrode 3 is formed of an n type polycrystalline silicon film doped to have a concentration as high as about $1\times10^{20}/cm^3$ to about $1\times10^{21}/cm^3$, there is not the influence of introduction of negative charges 8. Though negative charges 8 are also introduced to the regions of silicon oxide film 2 below the drain region 5c and below the source region 5b, source region 5b and drain region 5c are also free from the influence of negative charges 8, since they are formed of p type polycrystalline silicon films doped to a high concentration of about $1\times10^{19}/cm^3$. After ion implantation of fluorine, heat treatment at 800° C. to 900° C. is performed for about 30 minutes, so as to activate the implanted impurity.

Figure 4:
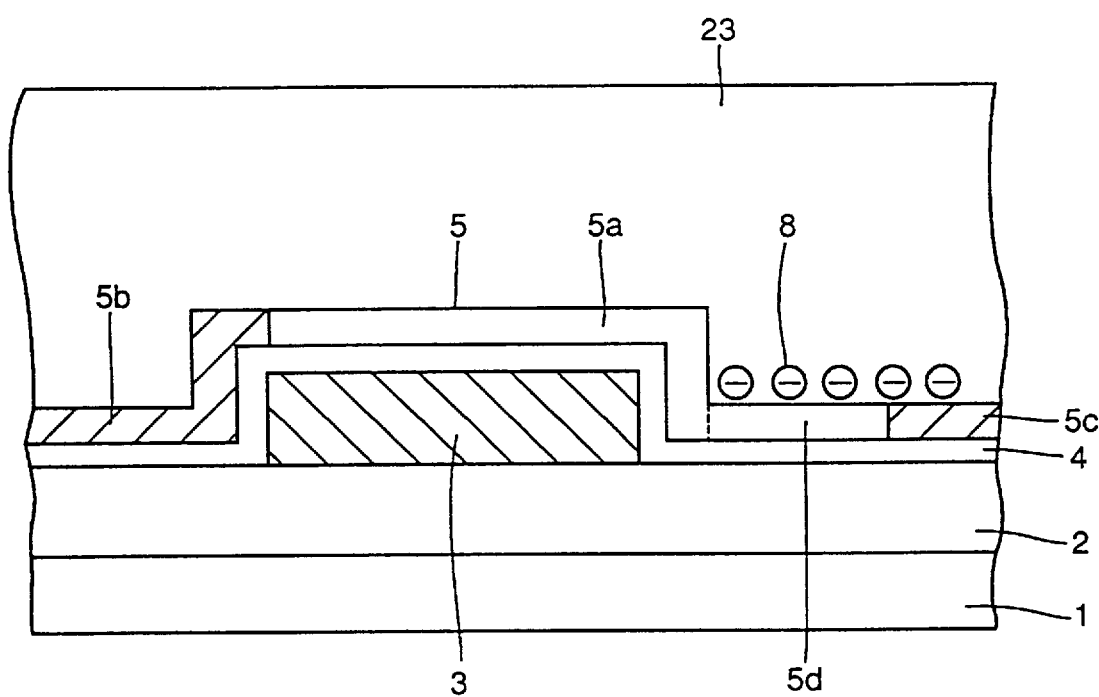
FIG. 4 is a cross section showing a modification of the thin film transistor in accordance with the first embodiment of the present invention.

The fact that ion implantation of fluorine into the insulating film provides negative charges has been found by an experiment on an MOS capacitor performed by the inventor of the present invention. In this experiment, C-V characteristic indicating the relation between static capacitance C and gate voltage Vg of the MOS capacitor was studied by grounding a silicon substrate 12 and applying the gate voltage Vg to a gate electrode 10, with fluorine implanted and not implanted to the gate oxide film 11 of the MOS capacitor shown in FIG. 3. As a result, it was found that when fluorine was implanted to oxide film 11, the flat band voltage $V_{FB}$ shifted in the positive direction, as compared with when fluorine was not implanted. The flat band voltage $V_{FB}$ is the sum of the work function difference $\phi_{MS}$ between gate electrode 10, which is a metal, and silicon substrate 12, which is a semiconductor, and the potential of charges $Q_{OX}$ in gate oxide film 11, which is represented as:

$$V_{FB}=\phi_{MS}-Q_{OX}/C_{OX} \quad (1)$$

where $C_{OX}$ represents electrostatic capacitance of gate oxide film 11. More specifically, according to the equation (1), the flat band voltage $V_{FB}$ changes because of the charges $Q_{OX}$ in gate oxide film 11. Therefore, the fact that the flat band voltage $V_{FB}$ shifted in the positive direction in this experiment means that fluorine introduced in gate oxide film 11 had formed negative charges. Though a structure in which negative charges are implanted in that region of silicon oxide film 2 which is below the offset region 5d has been described, the negative charges may be implanted in the interlayer insulating film 23 on offset region 5d as shown in FIG. 4. In that case, a slightly inverted layer would be formed on the upper side portion of the offset region 5d. Though the negative charges 8 are formed by fluorine in this example, any impurity other than fluorine may be used provided that it forms negative charges. For example, the negative charges can be provided by implanting aluminum. Generation of negative charges by implanting aluminum into an insulating film is disclosed, for example, in 1988 *SYMPOSIUM ON VLSI TECHNOLOGY, DIGEST OF TECHNICAL PAPERS*, P. 19.

The function and effect provided by the structure of the thin film transistor in accordance with the present embodiment will be described. In the thin film transistor of the present embodiment, because of the negative charges existing below offset region 5d, electrons, which are majority carriers existing at the lower surface of offset region 5d of n type polycrystalline silicon film, repel and move upward, and a portion near the lower surface of n type offset region 5d comes to be in a slightly inverted state. This facilitates flow of holes when a negative voltage is applied to gate electrode 3 and the thin film transistor is set to the on state. More specifically, since current restriction in offset region 5d is released, a large drain current can be obtained. In the off state in which the gate voltage is 0, the electric field applied to the end portion B of the drain region by offset region 5d is made weaker, reducing the off current. This relaxing of the electric field is not hindered by the negative charges but rather the electric field is further relaxed by appropriate amount of charges, whereby the off current can be suppressed. More specifically, since negative charges 8 changes the potential at the lower surface of offset region 5d, potential gradient of offset region 5d is relaxed and thus the maximum value of the electric field of offset region 5d can be reduced. Therefore, the off current, which increases in proportion to the maximum value of the electric field, can be suppressed.

Figure 5:
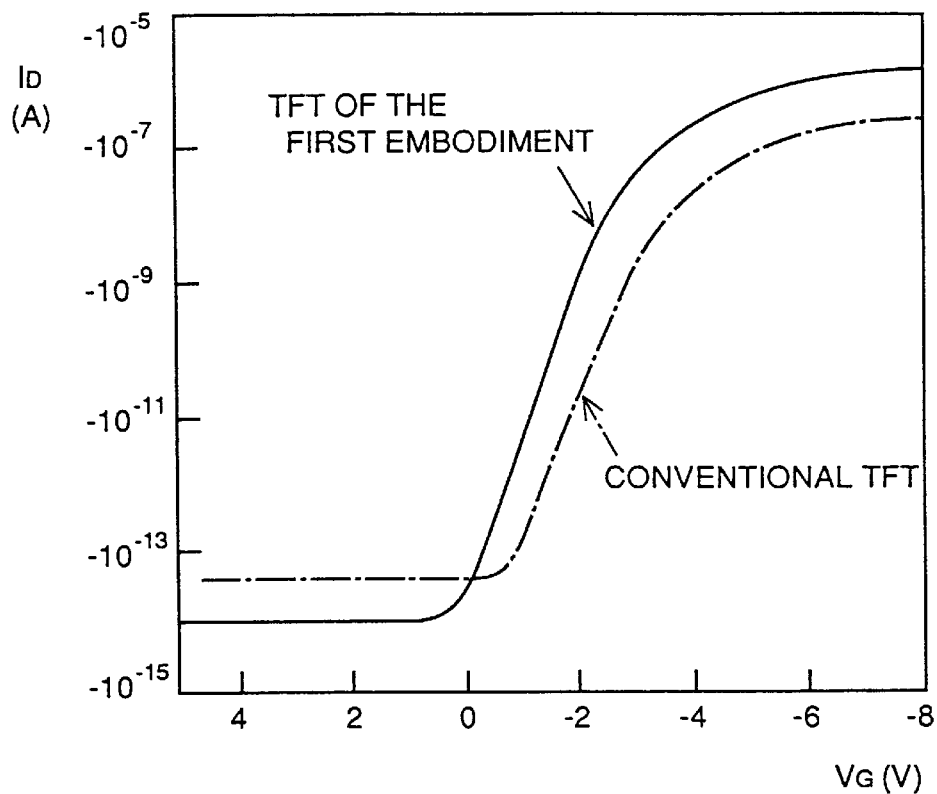
FIG. 5 shows, in comparison, I-V characteristic of the thin fi/m transistor in accordance with the first embodiment of the present invention and of a conventional thin film transistor.

FIG. 5 shows the gate voltage $V_G$-drain current $I_D$ characteristics of the thin film transistor having negative charges 8 formed therein and of a conventional thin film transistor. In this embodiment, negative charges 8 were formed by implanting fluorine to $1\times10^{13}/cm^2$ to offset region 5d having the length of 0.4 μm. The drain voltage $V_D$ of $-3V$ was applied. As can be seen from FIG. 5, in this embodiment, in the on state in which the gate voltage $V_G$ is negative, the drain current $I_D$ is increased, while in the off state in which the gate voltage $V_G$ is positive, the drain current $I_D$ is reduced.

In this embodiment, negative charges 8 are further introduced to polycrystalline silicon film 5 by ion implantation to form the negative charges 8 or through subsequent heat treatment. If the negative charges 8 are provided by fluorine, the leak current flowing in polycrystalline silicon film 5 can be further reduced, since fluorine has a function of filling defects in polycrystalline silicon film 5 as well.

Though a p channel type thin film transistor has been described in the present embodiment, it can be similarly applied to an n channel type thin film transistor. However, in that case, charges to be implanted are not negative charges but positive charges. Arsenic (As), phosphorus (P) or the like may be used as the impurity to be implanted for forming such positive charges. Though a bottom gate type thin film transistor in which gate electrode 3 is positioned below channel region 5a has been described in the present embodiment, it can be similarly applied to a top gate type thin film transistor in which gate electrode 3 is positioned above channel region 5a.

A second embodiment of the present invention will be described with reference to FIGS. 6 to 12. In this embodiment, the same or corresponding portions as the first embodiment described above are denoted by the same reference characters and detailed description thereof is not repeated. The thin film transistor of the present embodiment includes a p type polycrystalline silicon pad 20 for drawing drain region 5c to aluminum interconnection 24. The polycrystalline silicon pad is provided on silicon oxide film 2 and extends to a portion below gate electrode 3, with silicon oxide film 22 interposed. In the thin film transistor of the present embodiment, a p type polycrystalline silicon pad 21 is further provided to draw source region 5b to aluminum interconnection 25. In this embodiment, contacts for aluminum interconnections 24 and 25 are not provided directly from source region 5b or drain region 5c but through polycrystalline silicon pads 20 and 21 from the following reason. Namely, if the polycrystalline silicon film 5 has a film thickness as thin as 500 Å or less and contacts for aluminum interconnections 24 and 25 are directly taken therefrom, the polycrystalline silicon film 5 may possibly be pierced through when contact holes for aluminum interconnections 24 and 25 are opened, which must be avoided. On an upper surface of active layer 5, an interlayer insulating film 23 is formed.

Figure 7:
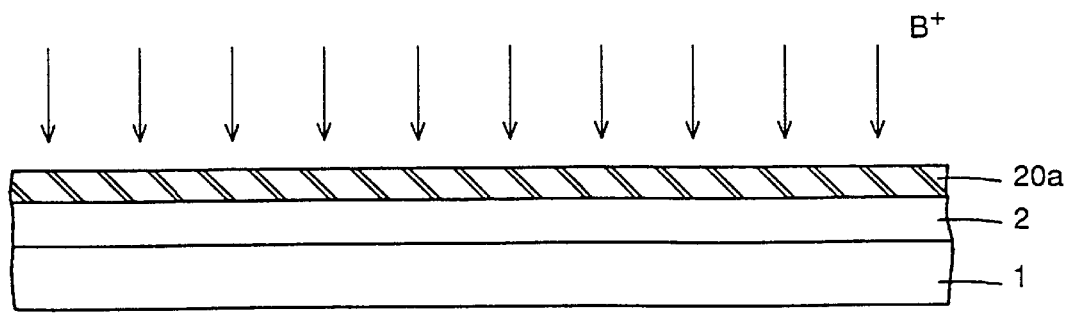
FIGS. 7, 8, 9, 10, 11 and 12 are cross sections showing, in order, the steps of manufacturing the thin film transistor in accordance with the second embodiment of the present invention.
Figure 8:
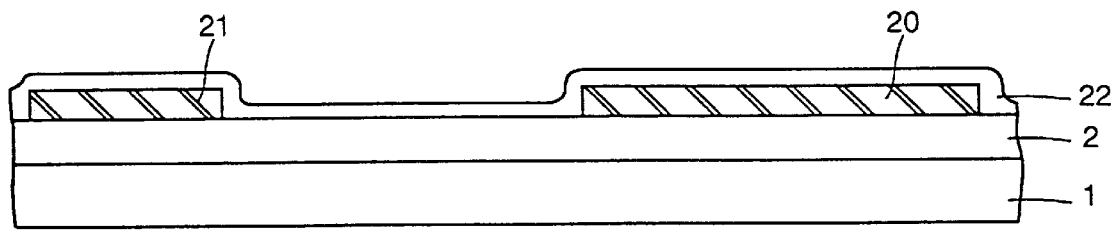

A method of manufacturing the thin film transistor of the present embodiment shown in FIG. 6 will be described. First, on a substrate 1 of silicon, silicon oxide film 2 is formed by LPCVD (Low Pressure Chemical Vapor Deposition) to the thickness of about 4000 Å. Then, on silicon oxide film 2, a polycrystalline silicon film having the thickness of about 1000 Å is formed by LPCVD method at 600° C., boron is ion-implanted thereto under the condition of 10 keV to 20 keV and $1\times10^{15}/cm^2$, and thus a p type polycrystalline silicon film 20a is formed (FIG. 7). Then, polycrystalline silicon film 20a is patterned to a desired shape to provide polycrystalline silicon pads 20 and 21, and thereafter a silicon oxide film 22 of about 500 Å is formed by LPCVD method at 800° C. (FIG. 8).

Figure 9:
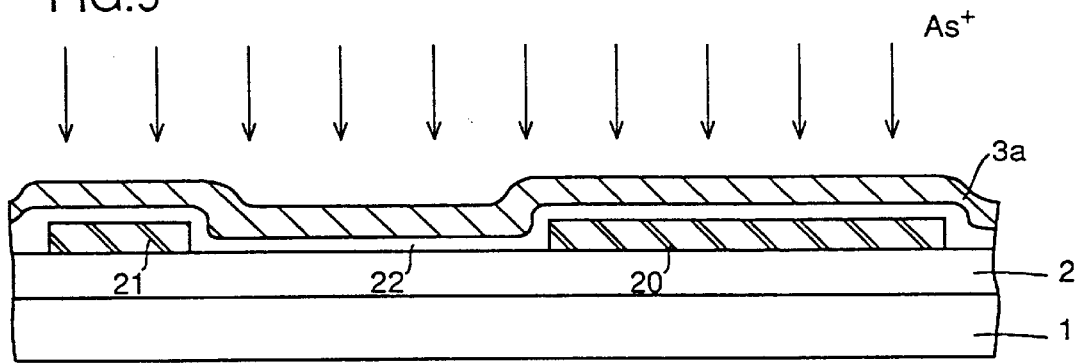
Figure 10:
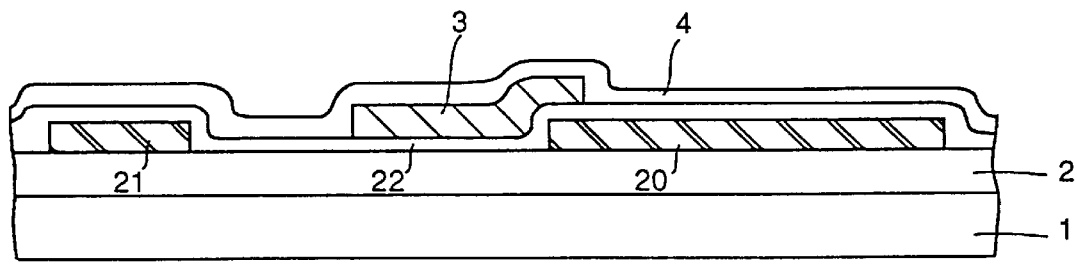

Thereafter, a polycrystalline silicon film of about 1000 Å is formed by the LPCVD method, arsenic (As) is ion-implanted thereto under the condition of 40 keV to 50 keV and $1\times10^{15}/cm^2$, and thus n type polycrystalline silicon film 3a is formed (FIG. 9). Then, by patterning polycrystalline silicon film 3a to a desired shape, gate electrode 3 is formed, and a silicon oxide film (gate insulating film 4) of about 300° C. is formed by the LPCVD method at 850° C. (FIG. 10). At this time, as shown in FIG. 10, patterning is performed such that gate electrode 3 and polycrystalline silicon pad 20 on the side of the drain have regions overlapped with each other, with gate insulating film 4 interposed.

Figure 11:
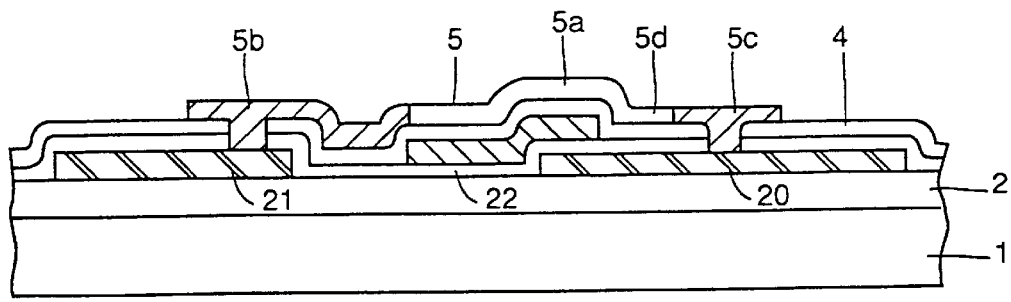

Then, contact holes are provided in gate oxide film 4 and silicon oxide film 22, and polycrystalline silicon film 5 which will be the body of the thin film transistor is formed to the thickness of 400 Å by the LPCVD method. Thereafter, using a photoresist as a mask, boron is ion-implanted under the condition of 10 keV and $10\times10^{15}/cm^2$, the photoresist is removed, and heat treatment at 850° C. is performed, thus forming source region 5b and drain region 5c. By ion implanting arsenic to the entire upper surface of substrate 1 under the condition of 20 keV and $1\times10^{12}/cm^2$, n type channel region 5a and offset region 5d are formed (FIG. 11).

Figure 6:
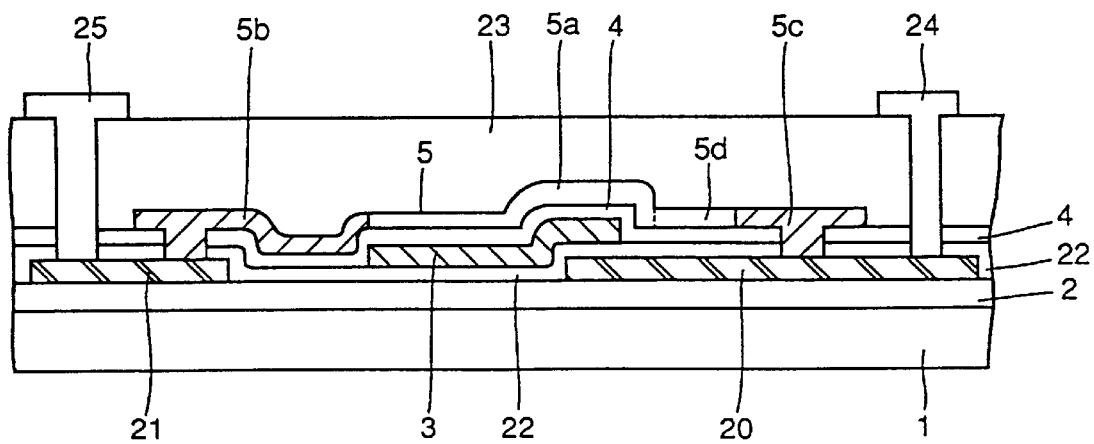
FIG. 6 is a cross section showing a structure of a thin film transistor in accordance with a second embodiment of the present invention.

Finally, a silicon oxide film (interlayer insulating film 23) is formed, contact holes are provided in interlayer insulating film 23, gate insulating film 4 and silicon oxide film 22, and aluminum electrodes 24 and 25 are provided, thus completing the thin film transistor shown in FIG. 6.

The function and effect of the present embodiment will be described. To drain region 5c, a prescribed negative voltage is constantly applied from aluminum interconnection 24 through polycrystalline silicon pad 20. Namely, the same negative voltage is constantly applied to polycrystalline silicon pad 20. If polycrystalline silicon pad 20 is extended below offset region 5d to a portion below gate electrode 4, the conductivity type near the lower surface of offset region 5d can be slightly inverted by the negative voltage, whereby resistance against holes can be reduced. Therefore, the on current is not restricted by the resistance of the offset region 5d, and hence a large on current can be obtained.

Since gate electrode 3 and polycrystalline silicon pad 20 on the side of the drain have overlapping regions in the thin film transistor of the present embodiment, there is provided a capacitance between gate electrode 3 and polycrystalline silicon pad 20. This capacitance serves to increase capacitance between a cell power supply Vcc and storage electrode in the cell of, for example, an SRAM, improving immunity to soft errors of the cell operation.

Figure 12:
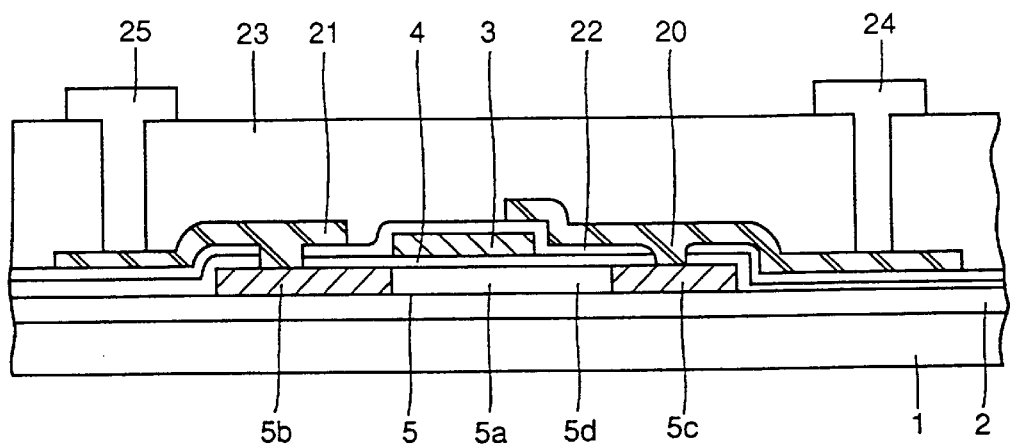

In the present embodiment, the thicknesses of silicon oxide film 22 and gate insulating film 4 determine the degree of inversion of the conductivity type of offset region 5*d*, and therefore it is of critical importance to optimize the thicknesses of these films. If the films are too thick, the conductivity type of offset region 5*d* is not inverted, and the effect of the present invention cannot be obtained. If the films are too thin, the conductivity type of offset region 5*d* is inverted too much, resulting in strong electric field at an end portion of the offset region, hindering the effect of reducing leak current. From these reasons, it is preferable that when the thickness of gate insulating film 4 is from 70 Å to 300 Å, the silicon oxide film 22 has a thickness thinner than that. Though a p channel type thin film transistor only has been described in the present embodiment, it can be also applied to an n channel type thin film transistor. Though a bottom gate type thin film transistor in which gate electrode 3 is positioned below channel region 5*a* has been described in the present embodiment, it can be also applied to a so called top gate type thin film transistor in which gate electrode 3 is positioned above channel region 5*a*. An example of a structure in which the concept of the thin film transistor of the present embodiment is applied to a top gate type thin film transistor is shown in FIG. 12. In the structure shown in FIG. 12, an active layer 5 including channel region 5*a*, source region 5*b*, drain region 5*c* and offset region 5*d* is formed on a top surface of substrate 1 with silicon oxide film 2 interposed, and above channel region 5*a* of active layer 5, gate electrode 3 is formed with gate insulating film 4 interposed. Near the right end of gate electrode 3, a polycrystalline silicon pad 20 connected to drain region 5*c* has an overlapping portion opposing to gate electrode 3 with silicon oxide film 22 interposed.

Figure 13:
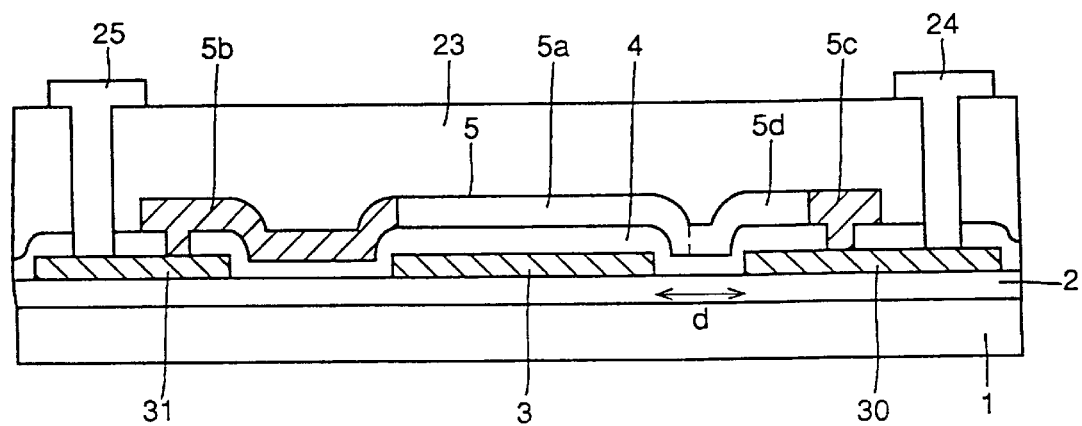
FIG. 13 is a cross section showing a structure of a thin film transistor in accordance with a third embodiment of the present invention.

A third embodiment of the present invention will be described with reference to FIG. 13. Referring to FIG. 13, the same or corresponding portions as the thin film transistor of the second embodiment shown in FIG. 6 are denoted by the same reference characters and detailed description thereof is not repeated.

In the thin film transistor of the present embodiment, referring to FIG. 13, an n type polycrystalline silicon pad 30 is provided on silicon oxide film 2, for connecting drain region 5*c* to aluminum interconnection 24. On silicon oxide film 2, an n type polycrystalline silicon pad 31 is provided for connecting source region 5*b* to aluminum interconnection 25. Polycrystalline silicon pad 30 and offset region 5*d* are configured such that they have overlapped portions opposing to each other with gate insulating film 4 interposed, and polycrystalline silicon pad 30 and gate electrode 3 are arranged to be spaced by a prescribed distance d. The function and effect derived from the provision of polycrystalline silicon pad 30 are the same as those described in embodiment 2, and the distance d between polycrystalline silicon pad 30 and gate electrode 4 should preferably be from 0.02 μm to 0.2 μm.

Figure 22:
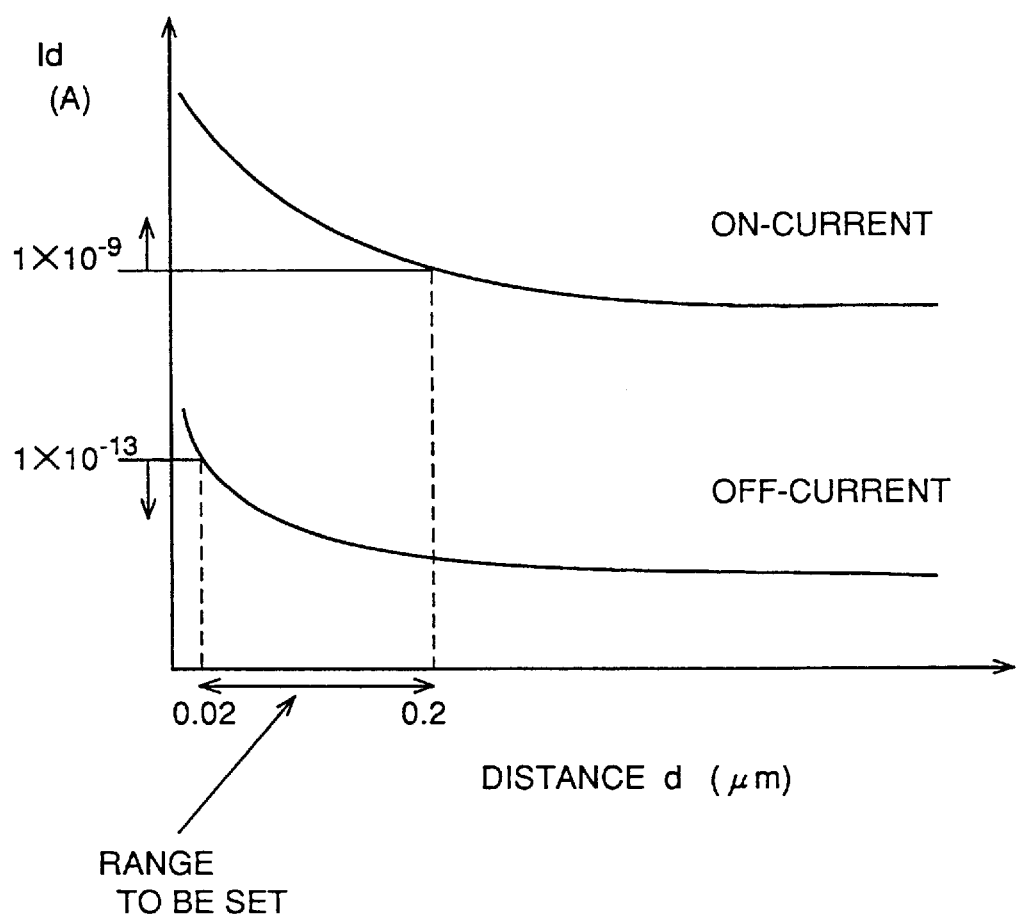
FIG. 22 shows relation between a distance d between the polycrystalline silicon pad 30 and the gate electrode 3 and the on current and the off current, of the thin film transistor in accordance with the third embodiment of the present invention.
Figure 23:
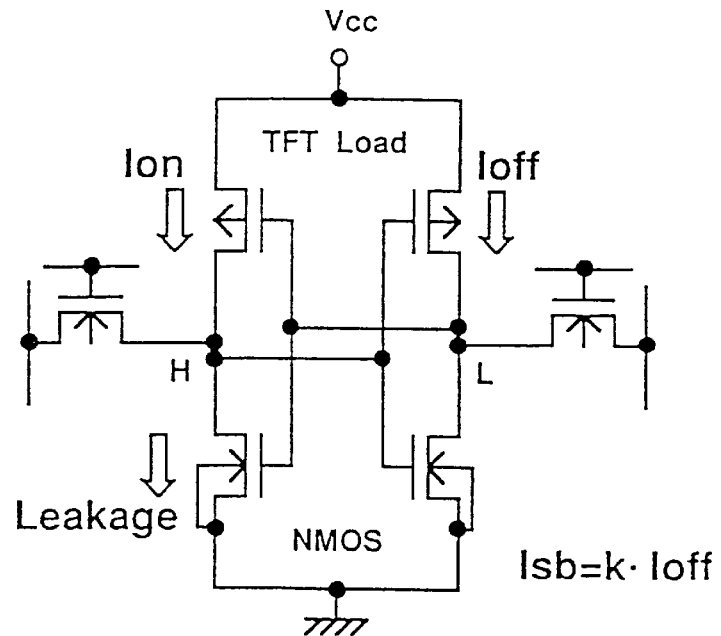
FIG. 23 is an equivalent circuit diagram of a memory cell of a SRAM in which a thin film transistor is used as a load transistor.
Figure 24:
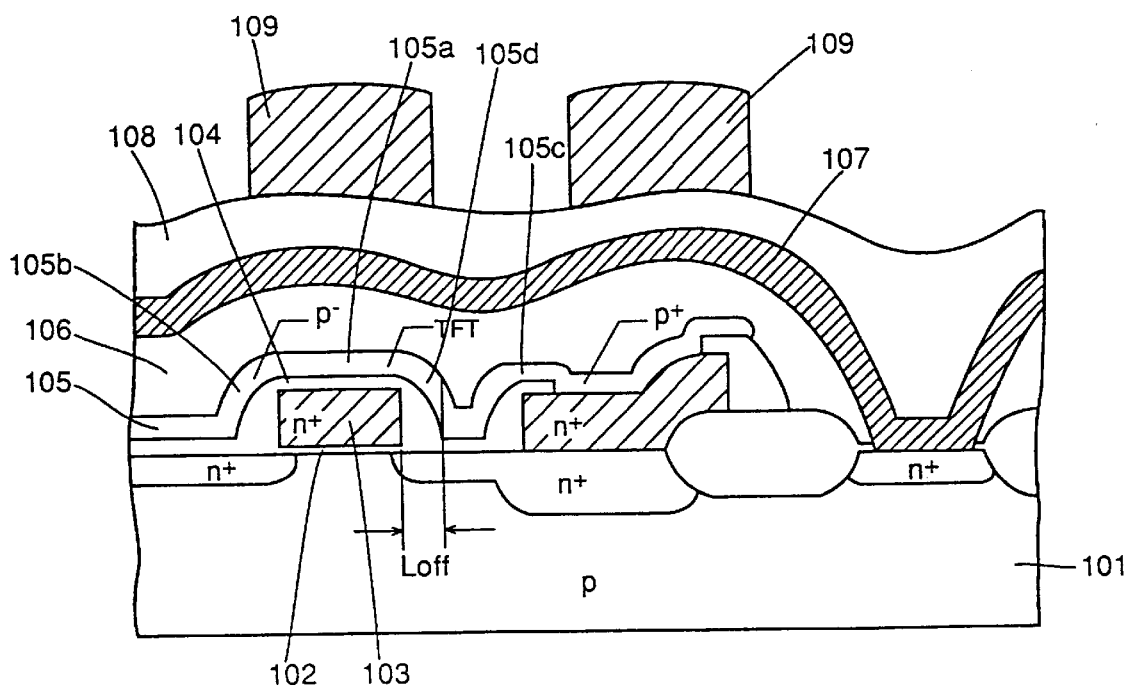
FIG. 24 shows an example of a cross sectional structure of a memory cell portion of a conventional SRAM in which a thin film transistor is used as a load transistor.

The reason why the distance d between polycrystalline silicon pad 30 and gate electrode 3 should preferably be from 0.02 μm to 0.2 μm will be discussed in the following, referring to the graph of FIG. 22. As the distance d between polycrystalline silicon pad 30 and gate electrode 3 changes the on current and the off current of the thin film transistor change as shown in FIG. 22. In a memory cell of an SRAM, generally it is required that the on current is at least 1 nA.

Therefore, from the graph of FIG. 22, it is understood that the distance d should be at most 0.2 μm. The off current should be as low as possible, and generally it should be 0.1 pA at most. Therefore, the distance d should necessarily be at least 0.02 μm. Accordingly, the distance d should be from 0.02 μm to 0.2 μm.

Gate electrode 3 and polycrystalline silicon pads 30 and 31 of the present embodiment are formed in the following manner. First, silicon oxide film 2 is formed on substrate 1, a polycrystalline silicon film of about 1000 Å is formed by the LPCVD method, and arsenic (As) is ion-implanted under the condition of 40 keV to 50 keV and $1 \times 10^{15} \text{cm}^2$ so as to form an n type polycrystalline silicon film. Thereafter, the polycrystalline silicon film is patterned to desired shapes, providing gate electrode 3 and polycrystalline silicon pads 30 and 31.

In the thin film transistor in accordance with the second embodiment shown in FIG. 6, polycrystalline silicon pads 20 and 21 and gate electrode 3 must be formed from separate polycrystalline silicon films due to structural limitation. Therefore, there is a problem of increased steps of manufacturing. By contrast, in the thin film transistor of the present embodiment, the polycrystalline silicon pads 30 and 31 and gate electrode 3 can be formed in the same step from one polycrystalline silicon film, and therefore as compared with the thin film transistor of the second embodiment, the number of steps can be reduced.

Since impurities are doped in gate electrode 3 and polycrystalline silicon pads 30 and 31 through one and the same step, polycrystalline silicon pads 30 and 31 come to have the same conductivity type, that is, n type as gate electrode 3, resulting in parasitic pn junctions between p type drain region 5*c* and n type polycrystalline silicon pad 30 and between p type source region 5*b* and n type polycrystalline silicon pad 31. However, since these pn junctions are junctions between polycrystalline silicons having match crystal defects, the current flowing therethrough is not limited by the parasitic pn junctions. In view of the structure, it is preferred that polycrystalline silicon pad 30 has the same conductivity type as drain region 5*a*, and polycrystalline silicon pad 31 has the same conductivity type as source region 5*b*. Therefore, the step of doping impurity may be performed separately for gate electrode 3 and for polycrystalline silicon pads 30 and 31.

A fourth embodiment of the present invention will be described with reference to FIG. 14. This embodiment provides a structure which is effective when it is difficult to set the distance d to be smaller than 0.2 μm because of technical limit of lithography in the third embodiment described above.

Figure 14:
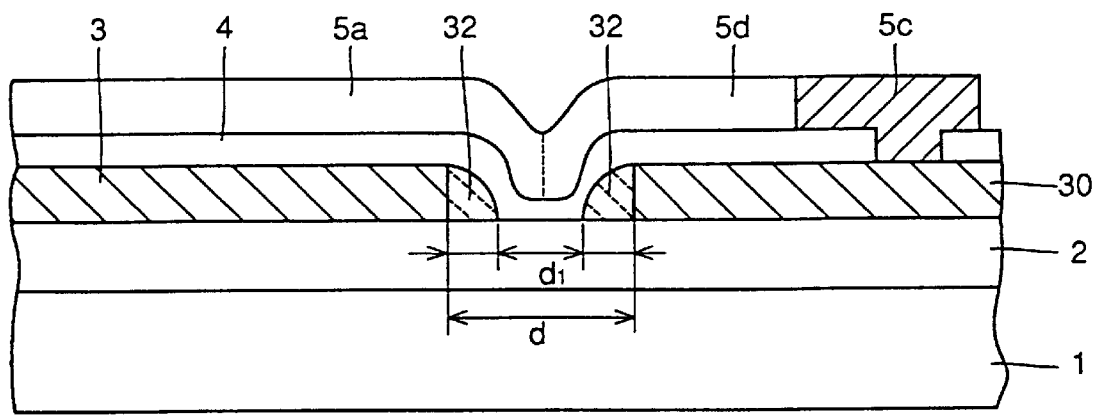
FIG. 14 is a cross section showing, in enlargement, an offset region of a thin film transistor in accordance with a fourth embodiment of the present invention.

Referring to FIG. 14, in the thin film transistor of the present embodiment, sidewall films 32 of n type polycrystalline silicon films are formed on opposing sidewalls of polycrystalline silicon pad 30 and gate electrode 3 which have the same structure as those of the thin film transistor shown in FIG. 13. By the provision of sidewall 32, the target value of 0.2 μm or smaller can be realized even if the distance d shown in FIG. 14 is 0.3 μm, by setting the width of each sidewall film 32 to 0.1 μm, for example.

Sidewall 32 is formed in the following manner. First, gate electrode 3 and polycrystalline silicon pads 30 and 31 of the third embodiments described above are formed, and then phosphorus doped polycrystalline silicon film is formed to the thickness of about 1000 Å by the LPCVD method. By etching the entire surface by anisotropic etching, sidewall films 32 are formed. In this anisotropic etching, the polycrystalline silicon film on the polycrystalline silicon film on which gate electrode 3 and polycrystalline silicon pads 30 and 31 are formed is etched. However, by precisely controlling etching time, pre-etching of gate electrode 3 and polycrystalline silicon pads 30 and 31 can be easily prevented.

Though a so called bottom gate type p channel thin film transistor has been described in the third and fourth embodiments above, it goes without saying that the present invention can also be applied to an n channel type thin film transistor and to a top gate type thin film transistor.

A fifth embodiment of the present invention will be described with reference to FIG. 15. In the first to fourth embodiments described above, the offset region has its conductivity type inverted by an electric field exerted externally. By contrast, in the present invention, the offset region itself is doped with p type impurity to a low concentration in advance.

Figure 15:
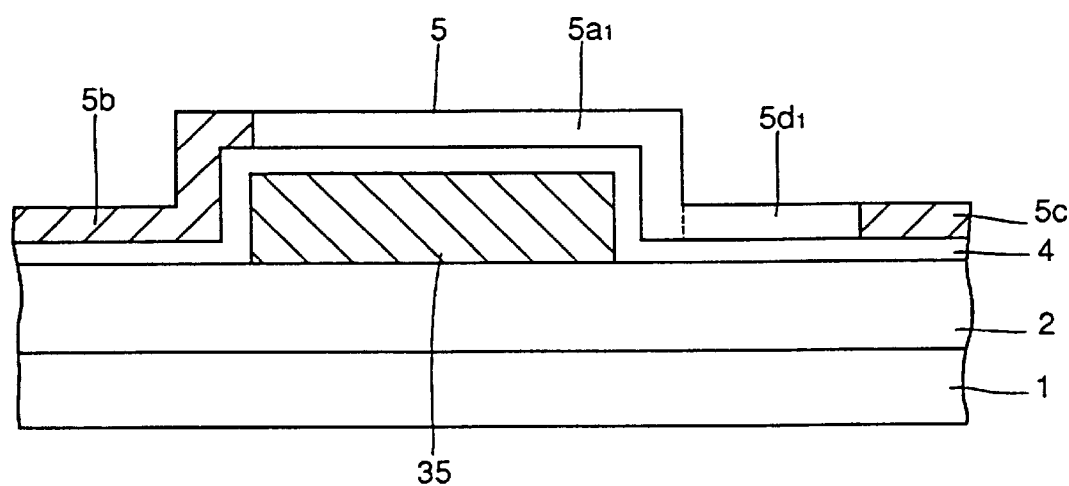
FIG. 15 is a cross section showing a structure of a thin film transistor in accordance with a fifth embodiment of the present invention.

Referring to FIG. 15, in the thin film transistor of the present embodiment, a gate electrode 35 is selectively formed on substrate 1 with silicon oxide film 2 interposed. On the surfaces of silicon oxide film 2 and of gate electrode 35, gate insulating film 4 is formed, and active layer 5 of polycrystalline silicon is formed further thereon. Active layer 5 includes a channel region $5a_1$ lightly doped with p type impurity, an offset region $5d_1$ lightly doped with p type impurity, and source region 5b and drain region 5c heavily doped with p type impurity. Gate electrode 35 is formed of a material which has work function difference $\phi_{MS}$ with respect to silicon of at least 1V in the negative direction.

In the thin film transistor of the present embodiment structured as described above, since offset region 5d is lightly doped to be p type, when gate voltage is applied, holes easily flow in offset region $5d_1$, preventing decrease of the on current. However, in order to set offset region $5d_1$ only to p type and to set channel region $5a_1$ to n type, separate steps of lithography for providing offset region $5d_1$ and for channel region $5a_1$ are required. Therefore, not only offset region $5d_1$ but also channel region $5a_1$ are lightly doped with p type impurity. More specifically, when both the offset region 5d, and channel region $5a_1$ are to be doped to p type to low concentration, it is not necessary to provide a mask, and they can be doped simply by introducing boron to the entire surface to about $1\times10^{12}/cm^2$. Therefore, offset region $5d_1$ can be made p type without increasing the number of steps and without causing a problem of mask misalignment, as it is not necessary to provide a mask.

However, if channel region $5a_1$ is to be also doped to p type, threshold voltage $V_{th}$ becomes too low (as the threshold voltage $V_{th}$ is shifted to the positive direction in a p channel type thin film transistor), providing a so called depletion type transistor, causing increased leak current. In case of an n channel type thin film transistor, if it is an enhancement type one, the drain current is cut off when the gate voltage is 0V as the threshold voltage has a negative value. However, if it is a depletion time, the transistor turns on even if the gate voltage is 0V, and the current flows. If the thin film transistor is applied to the SRAM, it is required that the current value with the gate voltage of 0V is as small as possible, and therefore a depletion type thin film transistor cannot be used. Therefore, the gate electrode 35 is formed by using a material which provides large work function difference $\phi_{MS}$ with respect to silicon in the negative direction, so that the enhancement type threshold voltage is ensured.

Magnesium (Mg) may be used as such a material of the gate electrode 35. When magnesium is used, the work function difference $\phi_{MS}$ with respect to silicon is −1.9V. When an n⁺ polycrystalline silicon is used which has been conventionally used as the material of gate electrode 35, the work function difference (MS with respect to silicon is −0.55V. Therefore, when magnesium is used as the material of gate electrode 35, the threshold voltage $V_{th}$ can be made higher by 1.35V in the negative direction as compared with the prior art.

The relation between the work function difference $\phi_{MS}$ between silicon and material of gate electrode 35 and the threshold voltage $V_{th}$ is given by the following equation (2):

$$V_{th} = \phi_{MS} - Q_{OX}/C_{OX} + \text{constant} \qquad (2)$$

where $Q_{OX}$ represents charges in gate insulating film 4, and $C_{OX}$ represents static capacitance of gate insulating film 4. If work function difference $\phi_{MS}$ has a large value in the negative direction, the threshold voltage $V_{th}$ of p channel thin film transistor can also have a large value in the negative direction. Therefore, even if the threshold voltage $V_{th}$ becomes low resulting in a depletion type thin film transistor because of low concentration p type channel region $5a_1$, it can be turned to an enhancement type thin film transistor by using as the gate electrode, a material such as magnesium providing work function difference $\phi_{MS}$ having a negative value of which absolute value is larger than 1V with respect to silicon, since, by doing so, the threshold voltage $V_{th}$ in the negative direction can be made higher in the p channel thin film transistor.

In this embodiment, by doping the offset region and the channel region with n type impurity to low concentration and by forming the gate electrode by using a material providing work unction difference $\phi$hd MSwith respect to silicon large in the positive direction, the present invention can be similarly applied to an n channel type thin film transistor. In addition, the present invention can also be applied to a top gate type thin film transistor.

Figure 16:
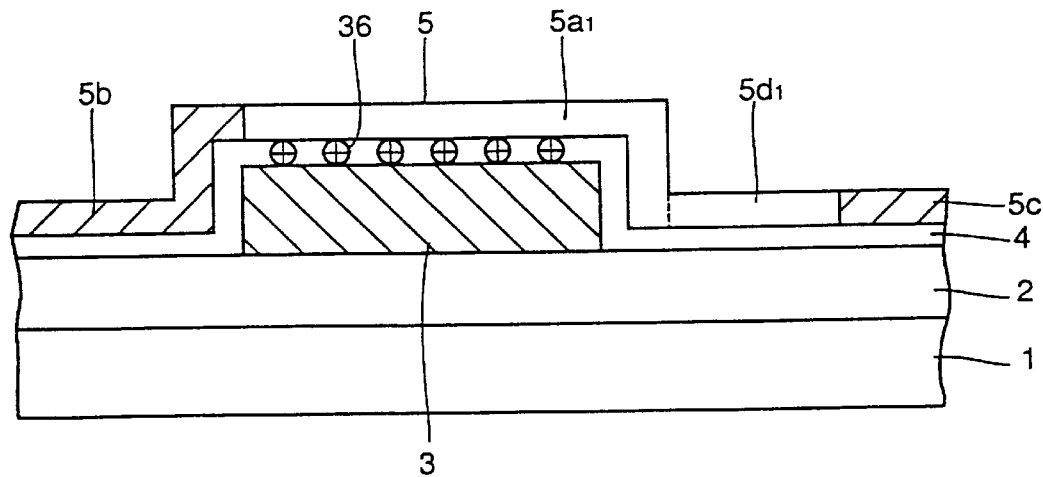
FIG. 16 is a cross section showing a structure of a thin film transistor in accordance with a sixth embodiment of the present invention.
Figure 17:
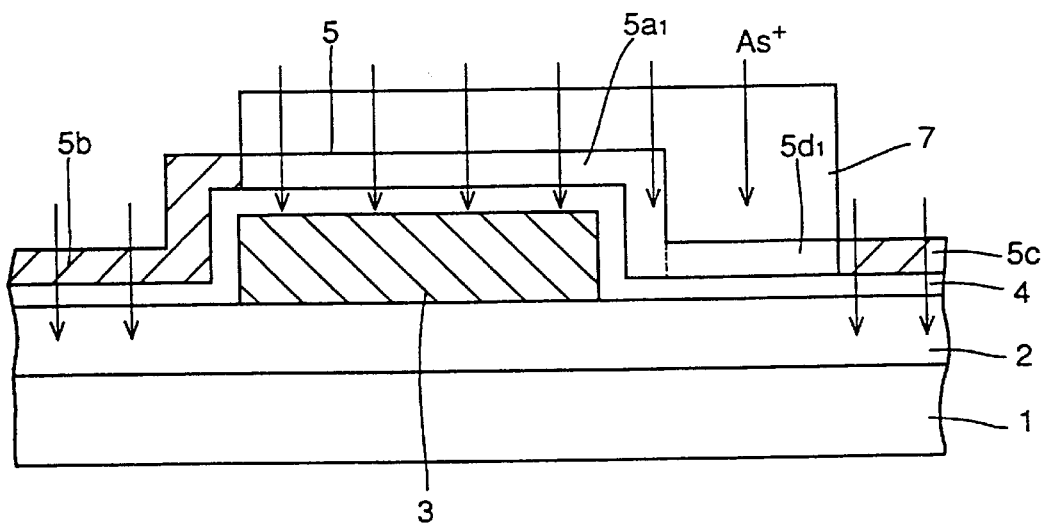
FIG. 17 is a cross section showing the step of ion-implanting arsenic to form positive charges in a region above a gate electrode 3 of gate insulating film 4, in the method of manufacturing the thin film transistor in accordance with the sixth embodiment of the present invention.

A sixth embodiment of the present invention will be described with reference to FIGS. 16 and 17. In the present embodiment, the same or corresponding portions as those of the fifth embodiment shown in FIG. 15 are denoted by the same reference characters and detailed description thereof is not repeated.

In this embodiment, different from the fifth embodiment above, gate electrode 3 is formed of a conventional n type polycrystalline silicon, and positive charges 36 of about $1\times10^{11}/cm^2$ to about $1\times10^{13}/cm^2$ are formed in gate insulating film 4. In the fifth embodiment about, the problem of the shift of the threshold voltage $V_{th}$ in the positive direction caused by turning channel region $5a_1$ to p type is solved by selecting appropriate material of gate electrode 3. In the present embodiment, the threshold voltage $V_{th}$ is changed by positive charges 36 in the gate insulating film 4. More specifically, the threshold voltage $V_{th}$ changes dependent on the charges $Q_{OX}$ of gate insulating film 4 as represented by equation (2) in the fifth embodiment above. Therefore, by providing positive charges 36 as the charges $Q_{OX}$ in gate insulating film 4, the threshold voltage $V_{th}$ can be shifted to the negative direction, and therefore the threshold voltage $V_{th}$ which has shifted to the positive direction by p type channel region 5a, can be shifted back to the negative direction.

The positive charges 36 in gate insulating film 4 of the present embodiment are formed in the following manner. Referring to FIG. 17, after a resist 7 for forming source region 5b and drain region 5c are patterned, ions which will be the positive charges 36 in silicon oxide film (gate insulating film 4), for example arsenic ions, are implanted. Since the surface of resist 7 is flat as shown in FIG. 16 regardless of the steps of the underlying layer, ions can be implanted only to the gate insulating film 4 on gate insulating film 3 and not to offset region $5d_1$, provided that the center of the range of ion implantation is selected to be in the gate insulating film 4. Though ions are implanted to portions below source region 5b and drain region 5c, the source and drain regions 5b and 5c are free from the influence of the ions, since these regions are formed of a p type semiconductor of high concentration. Though positive charges 36 are provided by arsenic in this embodiment, other ions may be used provided that the ions provide positive charges. For example, phosphorus (P) may be used.

As another method for forming positive charges 36 in gate insulating film 4, −BT (Bias Temperature) stress may be applied to gate insulating film 4. This method utilizes the phenomenon that when the thin film transistor is kept at a high temperature of about 100° C. to about 200° C., a large negative voltage of about −10V to about −20V is applied and 0 voltage is applied to the source region 5b and drain region 5c, positive charges are generated in gate insulating film 4. Details of this method is disclosed in 1993 *VLSI Symposium*, p. 29.

The present embodiment can be similarly applied to an n channel type thin film transistor, by using negative charges instead of positive charges. Though a bottom gate type thin film transistor has been described in the above embodiment, it can be similarly applied to a top gate type thin film transistor.

Figure 18:
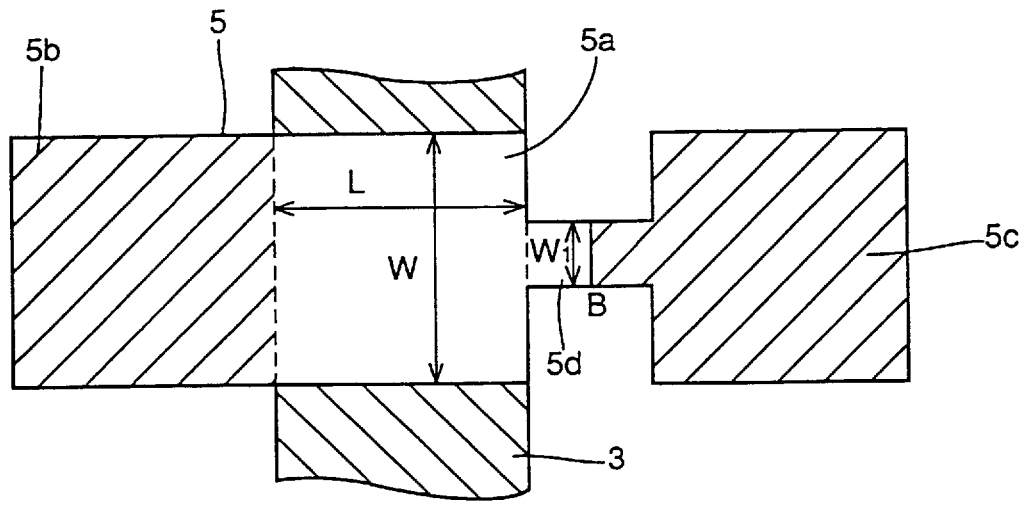
FIG. 18 is a planar layout of a thin film transistor in accordance with a seventh embodiment of the present invention.
Figure 19:
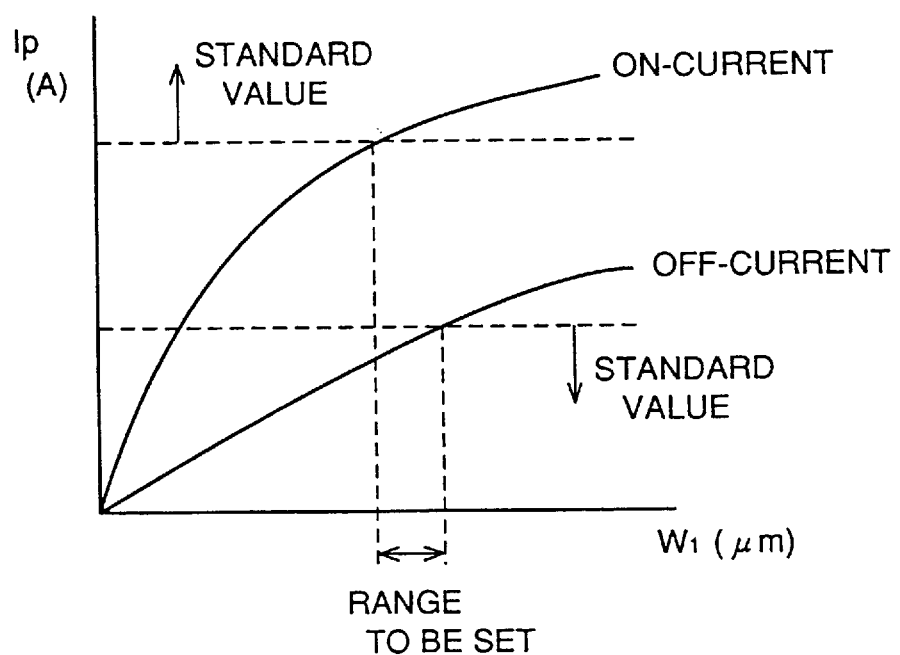
FIG. 19 shows conditions for setting the width of an end portion of the drain region, in the seventh embodiment of the present invention.
Figure 20:
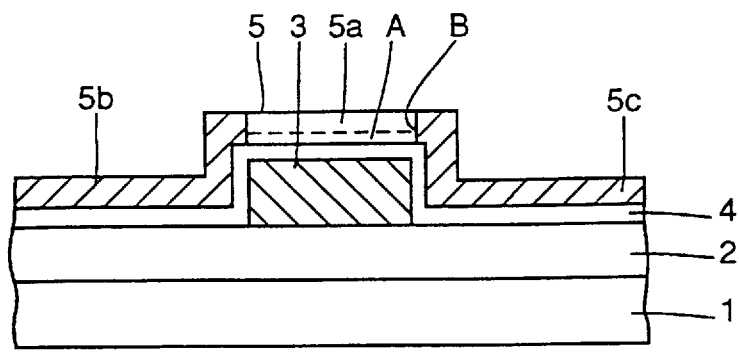
FIG. 20 is a cross section showing a structure of a conventional thin film transistor.
Figure 21:
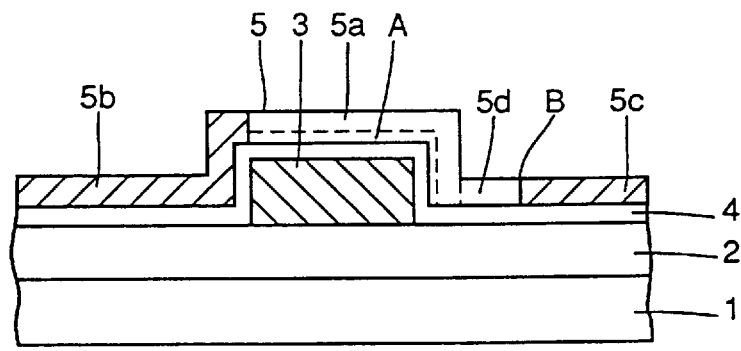
FIG. 21 is a cross section showing a structure of a conventional thin film transistor having an offset region.

A seventh embodiment of the present invention will be described with reference to FIGS. 18 and 19. Since this embodiment relates to the planar shape of channel region 5a, source region 5b, drain region 5c and offset region 5d constituting active region 5, only a planar layout of active layer 5 of the thin film transistor of the present embodiment is shown in FIG. 18. In FIG. 18, the reference character L denotes the length of channel region 5a, W denotes the width of channel region 5a, and $W_1$ denotes the width of the end portion B of drain region 5c.

In the thin film transistor of the present embodiment, the leak current in the off state is generated at the end portion B of drain region 5c, and therefore it is in proportion to the junction area (the width $W_1$ of end portion B×thickness of polycrystalline silicon film 5) at the end portion B of drain region 5c. However, since the on current is in proportion to the ratio W/L of the width W of channel region 5a with respect to the length L of channel region 5a, the structure in which only the width $W_1$ of the end portion B of drain region 5c is made narrower as shown in FIG. 18 is effective if the leak current only is to be lowered. By this structure, the junction area at the end portion B of drain region 5c is reduced, enabling reduction of leak current, while the width W of channel region 5a is kept wide enough not to decrease the on current. The value of the width $W_1$ of the end portion B of drain region 5c may be set within a range in which the width $W_1$ satisfies both the standard value of the on current and the standard value of the off current such as shown in FIG. 19.

This embodiment can also be similarly applied to an n channel type thin film transistor and to a top gate type thin film transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film transistor, comprising:

an active layer including a channel region of a first conductivity type, a source region of a second conductivity type adjacent to one end of the channel region, an offset region of the first conductivity type having one end connected to another end of said channel region, and a drain region of the second conductivity type connected to another end of the offset region;

a first insulating film formed on a first surface of said active layer;

a gate electrode formed at a position opposing to said channel region with said first insulating film interposed; and a second insulating film formed at a position opposing to said offset region with said first insulating film interposed, including an ion implanted impurity for forming charges in an amount sufficient to reduce the leakage current.

2. The thin film transistor according to claim 1, wherein said active layer includes a polycrystalline silicon film doped with an impurity.

3. The thin film transistor according to claim 2, wherein the impurity forming charges is fluorine; and the polycrystalline silicon film contains fluorine.

4. The thin film transistor according to claim 1, wherein said second conductivity type is p type and said charges are negative charges.

5. The thin film transistor according to claim 4, wherein said impurity is fluorine.

6. The thin film transistor according to claim 1, wherein said second conductivity type is n type and said charges are positive charges.

7. A thin film transistor, comprising:

an active layer including a channel region of a first conductivity type, a source region of a second conductivity type adjacent to one end of the channel region, an offset region of the first conductivity type having one end connected to another end of said channel region, and a drain region of the second conductivity type connected to another end of the offset region;

a first insulating film formed on a first surface of said active layer;

a gate electrode formed at a position opposing to said channel region with said first insulating film interposed; and a second insulating film formed at a position opposing to said offset region on a side of a second surface of said active layer, including an ion implanted impurity for forming charges in an amount sufficient to reduce the leakage current.

8. The thin film transistor according to claim 7, wherein said active layer includes a polycrystalline silicon layer doped with an impurity.

9. The thin film transistor according to claim 8, wherein the impurity for forming charges is fluorine, and the polycrystalline silicon film contains fluorine.

10. The thin film transistor according to claim 7, wherein said second conductivity type is p type and said charges are negative charges.

11. The thin film transistor according to claim 10, wherein said impurity is fluorine.

12. The thin film transistor according to claim 7, wherein said second conductivity type is n type and said charges are positive charges.

13. The thin film transistor according to claim 7, wherein said first insulating film contains a sufficient amount of charges in a region between the gate electrode and the channel region to provide enhancement type threshold voltage.

14. A thin film transistor, comprising:

an active layer including a channel region of a first conductivity type, a source region of a second conductivity type adjacent to one end of the channel region, an offset region of the first conductivity type having one end connected to another end of said channel region, and a drain region of the second conductivity type connected to another end of the offset region;

a first insulating film formed on a first surface of said active layer;

a gate electrode formed at a position opposing to said channel region with said first insulating film interposed; and a control electrode formed at a position opposing to said offset region with said first insulating film interposed, and connected to said drain region.

15. The thin film transistor according to claim 14, wherein an interconnection layer for applying a prescribed voltage to said drain region is connected to said control electrode.

16. The thin film transistor according to claim 14, wherein said gate electrode and said control electrode have overlapped regions opposing to each other with an insulating film interposed.

17. The thin film transistor according to claim 14, wherein a sidewall of said gate electrode and a sidewall of said control electrode oppose to each other with said first insulating film interposed, spaced by a distance of at least 0.02 μm and at most 0.2 μm.

18. The thin film transistor according to claim 14, wherein a sidewall of said gate electrode and a sidewall of said control electrode oppose to each other with said first insulating film interposed, said sidewalls of said gate electrode and said control electrode being covered by a conductive sidewall film.

19. The thin film transistor according to claim 14, wherein said control electrode includes a conductive film of said second conductivity type.

20. A thin film transistor, comprising:

an active layer including a channel region, a source region adjacent to one end of the channel region, an offset region having one end connected to another end of said channel region, and a drain region connected to another end of the offset region;

a first insulating film formed on a first surface of said active layer; and a gate electrode formed at a position opposing to said channel region with said first insulating film interposed; wherein said offset region is of the same conductivity type as said drain region, and work function difference between said gate electrode and said active layer is set to have an enhancement type threshold voltage.

21. The thin film transistor according to claim 20, wherein said channel region is of the same conductivity type as said offset region, and absolute value of work function difference between said gate electrode and said active layer is larger than 1V.

22. The thin film transistor according to claim 20, wherein said gate electrode is formed of magnesium.

23. A thin film transistor, comprising:

an active layer including a channel region, a source region adjacent to one end of the channel region, an offset region having one end connected to another end of said channel region, and a drain region connected to another end of the offset region;

a first insulating film formed on a first surface of said active layer; and a gate electrode formed at a position opposing to said channel region with said first insulating film interposed; wherein said first insulating film contains sufficient amount of charges to provide enhancement type threshold voltage.

24. A thin film transistor, comprising:

an active layer including a channel region, a source region adjacent to one end of the channel region, an offset region having one end connected to another end of said channel region, and a drain region connected to another end of the offset region;

a first insulating film formed on a first surface of said active layer; and a gate electrode formed at a position opposing to said channel region with said first insulating film interposed; wherein junction width of said drain region and said offset region is made narrower than width of said channel region.

25. The thin film transistor according to claim 24, wherein the junction width of said drain region and said offset region is made sufficiently narrower than the width of the channel region to reduce the leakage current.

* * * * *